US008667427B2

(12) United States Patent
DeMaris et al.

(10) Patent No.: US 8,667,427 B2
(45) Date of Patent: *Mar. 4, 2014

(54) METHOD OF OPTIMIZATION OF A MANUFACTURING PROCESS OF AN INTEGRATED CIRCUIT LAYOUT

(75) Inventors: David L. DeMaris, Austin, TX (US); Maria Gabrani, Zurich (CH); Ekaterina Volkova, Zurich (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/402,941

(22) Filed: Feb. 23, 2012

(65) Prior Publication Data

US 2012/0221984 A1     Aug. 30, 2012

(30) Foreign Application Priority Data

Feb. 24, 2011     (EP) .................................... 11155878

(51) Int. Cl.
*G06F 17/50*     (2006.01)

(52) U.S. Cl.
USPC ............................................. 716/51; 716/54

(58) Field of Classification Search
USPC ......................................................... 716/54
See application file for complete search history.

(56) References Cited

U.S. PATENT DOCUMENTS

| 6,563,566 | B2 | 5/2003 | Rosenbluth et al. |
| 7,158,917 | B1 * | 1/2007 | Bickford ...................... 702/181 |
| 7,558,419 | B1 | 7/2009 | Ye et al. |
| 2007/0038970 | A1 * | 2/2007 | DeMaris et al. .................. 716/4 |
| 2010/0083208 | A1 | 4/2010 | Lai et al. |
| 2011/0032499 | A1 * | 2/2011 | Kawashima ..................... 355/53 |
| 2012/0017194 | A1 | 1/2012 | Bagheri et al. |
| 2012/0216156 | A1 * | 8/2012 | Liu et al. .......................... 716/52 |

OTHER PUBLICATIONS

IBM, "Computational scaling—Project overview," http://www.zurich.ibm.com/sys/scaling, last visited Jan. 27, 2012.
IBM, "IBM Develops Computational Scaling Solution for Next Generation "22nm" Semiconductors," press release, http://www-03.ibm.com/press/us/en/pressrelease/25147.wss, Sep. 17, 2008.
Hand, "EUV lithography cannot come soon enough," EDN, http://www.edn.com/article/509434-EUV_lithography_cannot_come_soon_enough.php, Jun. 22, 201.0.
Liebmann, "Layout Impact of Resolution Enhancement Techniques:Impediment or Opportunity?," Proceedings of the 2003 international symposium on Physical design, Apr. 6-9, 2003.
Tian, et al., "Benefits and Trade-Offs of Global Source Optimization in Optical Lithography," Optical Microlithography XXII, Feb. 24, 2009.
Fraley, et al., "Model-based clustering, discriminant analysis, and density estimation," Technical Report No. 380, Univeristy of Washington, Oct. 2008.

* cited by examiner

*Primary Examiner* — Paul Dinh
*Assistant Examiner* — Bryce Aisaka
(74) *Attorney, Agent, or Firm* — Cantor Colburn LLP (57) ABSTRACT

A computer-implemented method, article of manufacture, and computer system for optimization of a manufacturing process of an integrated circuit or IC layout. The method includes: receiving input; organizing IC patterns; selecting IC patterns amongst the organized IC patterns; and optimizing a design of a manufacturing process of the IC layout based on the selected IC patterns.

15 Claims, 3 Drawing Sheets

METHOD OF OPTIMIZATION OF A MANUFACTURING PROCESS OF AN INTEGRATED CIRCUIT LAYOUT

CROSS-REFERENCE TO RELATED APPLICATIONS

This application claims priority under 35 U.S.C. §119 to European Patent Application No. 11155878.9 filed Feb. 24, 2011, the entire contents of which are incorporated by reference herein.

BACKGROUND OF THE INVENTION

1. Field of the Invention

The present invention broadly relates to computer-implemented methods of optimization of manufacturing processes for integrated circuit (IC) layouts, such as methods of lithographic printing of features for forming IC patterns on a semiconductor chip, and particularly to improvements in identifying and prioritizing patterns of an IC design on which to perform optimization of the lithographic process more effectively.

2. Description of the Related Art

In the manufacture of integrated circuits, photolithographic processes are commonly used, in which a wafer is patterned by projecting radiation through a patterned mask to form an image pattern on a photo sensitive material, referred to as a photoresist, or simply resist. The exposed resist material is developed to form openings corresponding to the image pattern, and then the pattern is transferred to the wafer substrate by methods such as etching, as known in the art.

Many methods have been developed to compensate for the image degradation that occurs when the resolution of optical lithography systems approaches the critical dimensions of the lithographic patterns used to form IC's. Critical dimension refers to the feature size and spacing between features and feature repeats (pitch) that are required by the design specifications and are critical for the proper functioning of on-chip devices. When the critical dimensions of an IC pattern approach the resolution of a lithographic system (defined as the smallest dimensions that can be reliably printed by the system), image distortions becomes a significant problem. Today the limited resolution of lithography tools poses a technical challenge in IC manufacture, and this difficulty may increase in the future as critical dimensions become increasingly smaller. In order to make the manufacture of future IC products feasible, lithography tools will be required to achieve adequate image fidelity when the ratio of the minimal critical dimension to resolution of the lithographic system is very low. For instance, extreme ultraviolet (EUV) lithography may not be ready soon enough. Thus, lithography for the 22 nm CMOS chip fabrication process still needs to use a 193 nm light source.

The basic lithography system consists of a light source, a photomask containing the pattern to be transferred to the wafer, a collection of lenses, and a means for aligning existing patterns on the wafer with patterns on the mask. Mask design processes as evoked herein cover many steps from the chip design to the mask fabrication.

Resolution enhancement techniques (RETs) such as OPC (optical proximity correction) are perhaps not sufficient to obtain sufficient printing quality (see Lars W. Liebmann. Layout Impact of Resolution Enhancement Techniques: Impediment or Opportunity?//International Symposium on Physical Design. Monterey, Calif., USA, April 2003).

Amongst other RETs, methods have been proposed for optimizing combinations of source illumination and mask patterns (referred to hereinafter as source-mask optimization or "SMO") together. Such methods can result in improved process windows (see, for example, U.S. Pat. No. 6,563,566).

SMO has been demonstrated for SRAM type of masks (having high symmetry and periodicity), more particularly for small size of designs. However, SMO methods are computationally expensive. It is therefore impractical to perform a SMO on a full chip layout. Thus, only some selected "hard-to-print" patterns are considered for full optimization. Currently, such patterns are usually identified using a set of predetermined rules that are determined experimentally for a specific chip design. However, the applicability of the rules is limited. Other methods rely on approximate imaging methods but are too slow for many applications.

The limits of SMO methods were addressed by using data compression solutions. Again, the underlying idea is that only those patterns which benefit the most from intensive optimizations should be selected for SMO (see e.g., Kehan Tian et al., Benefits and Trade-Offs of Global Source Optimization in Optical Lithography.//Optical Microlithography XXII. San Jose, Calif., USA. 24 Feb. 2009). According to this solution, a small subset of all patterns extracted from a full chip, also called source binding clips (SBC), is used in the source optimization (SO) to define the source that will then be used for the full mask optimization (MO), reducing significantly the computational requirements. There, the selection of the SBCs is critical, inasmuch as it defines the success of the source for the whole chip.

In a current approach, this subset of clips is selected by clustering the full set and taking one (or more) representatives from each cluster. The basic idea is that clustering aggregates patterns that are very similar, such that a selection of representative patterns is sufficient for the SO. Hence, the SBCs chosen to drive the SO critically depend on the clustering technique.

SUMMARY OF THE INVENTION

According to an aspect of the present invention, a computer-implemented method is provided for optimization of a manufacturing process of an integrated circuit or IC layout. The method includes: receiving input; organizing IC patterns; selecting IC patterns amongst the organized IC patterns; and optimizing a design of a manufacturing process of the IC layout based on the selected IC patterns.

The steps of receiving input and organizing IC patterns are performed prior to selecting IC patterns. The step of organizing IC patterns includes a condition to be satisfied. The input includes: (i) a set P of IC patterns $S_1, \ldots S_P$ extracted from the IC layout and a set F of features $F_1, \ldots F_P$, respectively associated to the IC patterns of the set P; and (ii) a distance function $D(F_i, F_j)$ for evaluating a distance $d=D(F_i, F_j)$ between two IC patterns $S_i, S_j$, based on respective features $F_i, F_j$ thereof, such that a distribution of pairs $I_0(d)$ can be determined, wherein the pairs $I_0(d)$ are of IC patterns of the set P with respect to a distance d between the pairs.

According to a further aspect of the present invention, an article of manufacture tangibly embodying computer readable instructions which, when implemented, cause a computer system to carry out the steps of the method of the present invention.

According to another aspect of the present invention, a computer system is provided for implementing the method of the present invention. The computer system includes a processor operatively interconnected to a memory device, a graphical display device, a user input device, and a graphical user interface displayed in the graphical display device.

According to yet another aspect of the present invention, a computer-implemented method is provided for manufacturing an integrated circuit (IC), based on a manufacturing process designed according to the method of the present invention.

DETAILED DESCRIPTION OF THE PREFERRED EMBODIMENTS

Systems and methods embodying the present invention will now be described, by way of non-limiting examples, and in reference to the accompanying drawings.

As outlined in introduction, techniques such as SMO are computationally too expensive for full chip optimization. Thus, only a subset of patterns is relied upon, which can for instance be selected by clustering the full set of patterns (as extracted from the IC layout) and taking one (or more) representative patterns from each cluster. Many variants to SMO schemes can be devised.

Yet, such methods can generally be regarded as computer-implemented methods of optimization of a manufacturing process for an IC layout, including the steps of: selecting patterns amongst patterns organized in clusters (or groups) of similar patterns; and optimizing a design of the manufacturing process of the IC layout (including e.g., SO, MO or SMO) based on the selected patterns.

The embodiments of the present invention allow for improving the pattern selection, which in turn improves the design of manufacturing process.

In some embodiments, the algorithm may work as follows: given a chip layout, and a given layer thereof, a clip extraction algorithm extracts patterns (also called clips), say $S_p$, p= 1, . . . , |P|, where |P| is the total number of patterns in the set P of extracted patterns. For each pattern $S_p$, a features extraction algorithm extracts a set (call it F) of features $F_p$, e.g., using a same vector format, of a given size. In other words, the set P of extracted patterns is mapped onto a set F of features, such that each feature (a vector) represents a respective pattern. The features at stake can for instance be obtained based on diffraction order coefficients (i.e., a form of Fourier coefficients). They can also be any transform (DCT, wavelets, . . . ) or any suitable set of geometric features (e.g., polygon information). Such "features" are known per se.

Now, in order to organize patterns in groups of similar patterns, a similarity measure is relied upon (e.g., pixel correlation or any suitable distance). To that aim, use is made of a distance function $D=D(F_i, F_j)$, which defines the similarity between two patterns $S_i$, $S_j$ as the distance between their respective features.

For example, two patterns shall be determined to be similar if the distance function evaluated for the two patterns satisfies a condition such as 'less than a given threshold Thr', i.e., $D(F_i, F_j) \leq Thr$.

Figure 5:
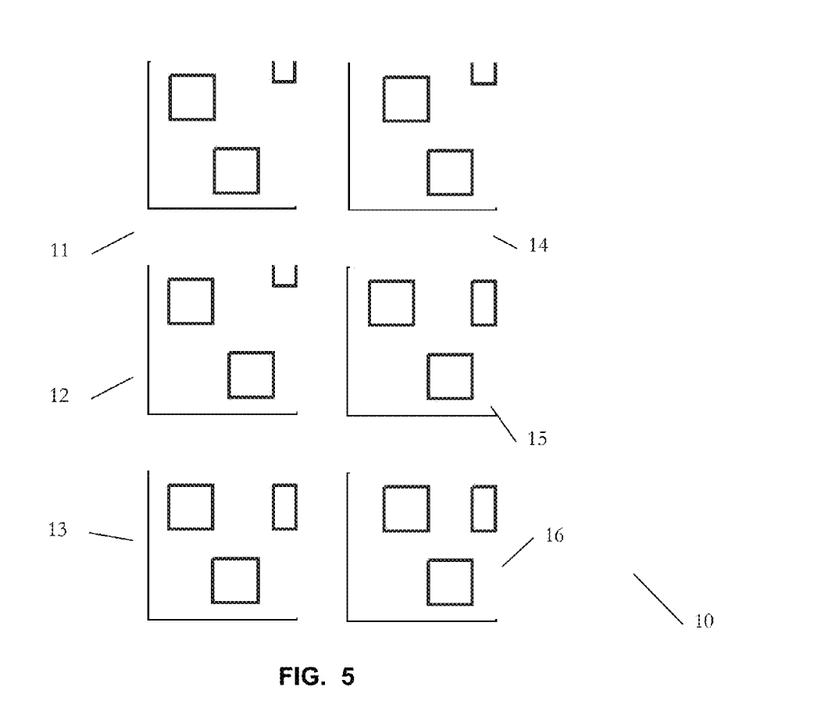
FIG. 5 shows an example of cluster (or group) of patterns obtained according to an embodiment of the present invention.

Only the truly distinct patterns are preferably considered. Thus, two distinct patterns having a distance smaller than or equal to the threshold Thr are retained as similar patterns. Of course, the condition could be expressed in many other, yet equivalent ways. For example, FIG. 5 shows a group (cluster) 10 of patterns 11-16 which are similar, to a certain extent, as obtained in embodiments.

Then, a question that rises is how to suitably define the condition, or equivalently the threshold, in order to get e.g., optimal patterns (e.g., SBCs or clips) for the subsequent optimization.

One solution as contemplated in some embodiments of the present invention is to design the condition (e.g., $D(F_i, F_j) \leq Thr$) based on one or more parameters of a probability distribution function I(d) or PDF, the latter matching the actual pair distribution $I_0(d)$ of patterns of set P, with respect to the distance d between the pairs. As we shall see, this allows for objectifying the condition, yet taking care of the actual pair distribution $I_0(d)$.

More generally, the solution provided makes the clustering algorithm dependent on a similarity condition, which itself is determined by a low end local average distance of $I_0(d)$. Accordingly, the optimization method can be automated in a larger extent, i.e., it allows for safely automating the clustering algorithm (i.e., the organization of patterns in groups) and provides, in practice, very convincing results for the source and mask optimization. ICs can therefore be more quickly and efficiently manufactured. A corresponding, actual manufacture of ICs is incidentally part of some embodiments of this invention.

Figure 1:
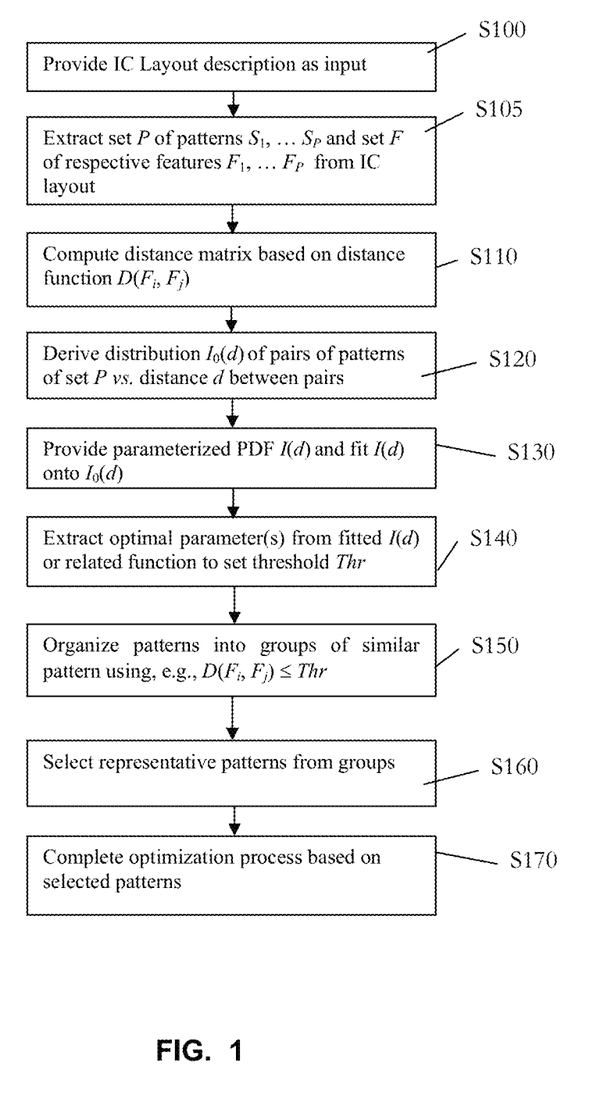
FIG. 1 is a flowchart of steps performed in an embodiment of the method of the present invention.

In reference to FIG. 1, some embodiments of the present invention can rely on:

(i) A description of an IC layout, provided as input, step S100;

(ii) A set P of patterns, extracted from the IC layout (or somehow pre-selected and given as input) and respective features, i.e., of the set F, step S105. As mentioned, the features preferably have all the same vector format. Extracted patterns are typically mapped onto the features, such that a distance function $D(F_i, F_j)$ can be evaluated for two patterns $S_i$, $S_j$, taking their respective vectors $F_i$, $F_j$ as argument. There are several possibilities for evaluating the distance between two vectors, e.g., Minkowski (or p-norm), Euclidian, etc., which a priori can be contemplated. However, $L^p$ spaces (Lebesgue spaces) are most convenient in the present context are these provide generalizations of p-norms for finite-dimensional (complex) vector spaces;

(iii) The distance function $D(F_i, F_j)$ itself, whereby a pair distribution $I_0(d)$ of patterns vs. a distance d between the pairs can be determined, steps S110-S120. The pair distribution $I_0(d)$ considered here can be regarded as describing the distribution of distances between pairs of patterns, yet independently of the orientations as d is typically a number, not a vector. In other words, $I_0(d)$ is typically an equivalent of the radial pair distribution function in an euclidian space or a pair correlation function. More generally, $I_0(d)$ can be any suitable function relatable to the probability of finding a pair of patterns spaced a distance d; and (iv) A PDF, also noted I(d), the latter having one or more parameters that make it possible to match the PDF with the actual pair distribution $I_0(d)$, step S130.

The above quantities can be regarded as inputs, at least at some point of the algorithm (i.e., at least after step S130), notwithstanding the variants discussed below.

Next, patterns are grouped into groups of similar patterns (clustering algorithm, step S150). Namely, two patterns are determined to be similar if the distance function evaluated for the two patterns satisfies a condition such as mentioned earlier. This condition involves one or more parameters of I(d), once suitably parameterized to match $I_0(d)$, step S140. In the following, this condition is considered to be equivalent $D(F_i, F_j) \leq \text{Thr}$.

Once groups have been formed (step S150), some representative patterns can be selected, step S160, for subsequent completion of the optimization process, step S170. The optimization process can for instance be a SO, MO or SMO method or the like, as discussed in introduction.

Accordingly, the present approach amounts to use data extracted from the IC layout description to set the condition, whereby the subjectivity of the condition is lowered. In that respect, the pattern diversity arising from various design styles, types of layers and layouts is such that the threshold cannot be safely taken as a fixed value, be it defined through an experimental or a theoretical approach.

In some embodiments of the present invention, pair distances between all extracted patterns are calculated, thereby defining a distance matrix, i.e., a triangular matrix with zero valued diagonal. From this distance matrix, the actual pair distribution $I_0(d)$ can be obtained. More importantly, this quantity is distinct from the PDF, noted I(d), the latter being a model representation of $I_0(d)$. Incidentally, identical patterns are preferably discarded, such that the total number of pairs described in the pair matrix or in $I_0(d)$ sum up to $N(N-1)/2$, i.e., the total number of distinct pairs, N being the number of extracted patterns.

Figure 2:
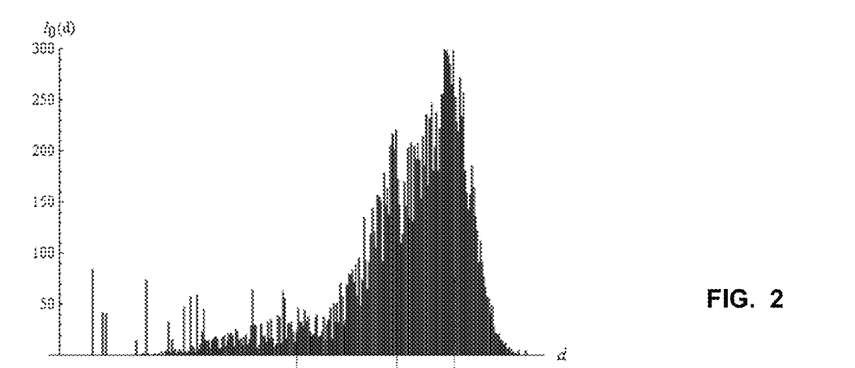
FIG. 2 shows an histogram representation of a given distribution of pairs $I_0(d)$ of patterns with respect to a distance d between the pairs according to an embodiment of the present invention.
Figure 3:
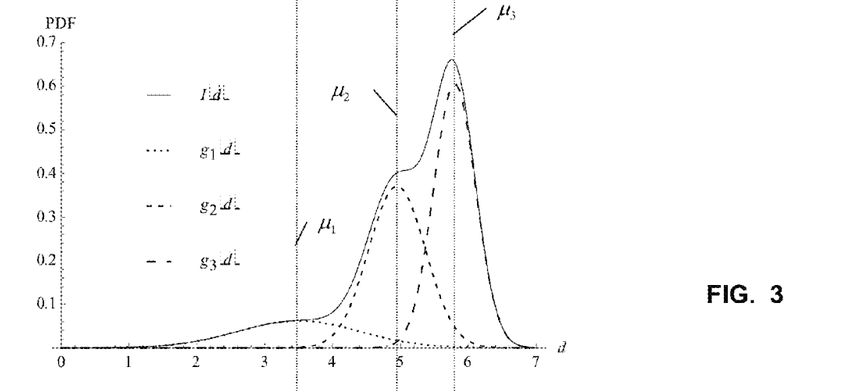
FIGS. 3 and 4 illustrate a probability distribution function I(d), parameterized so as to match the distribution $I_0(d)$ of FIG. 2, and a corresponding cumulative distribution function, respectively. The function I(d) is here defined as a finite sum of Gaussian-type functions $g_1(d)$-$g_3(d)$, according to an embodiment of the present invention.

An example of a typical pair distribution $I_0(d)$ is represented as a histogram in FIG. 2. The number of pairs (y-axis) of patterns found within the interval (d, d' $\Delta$d) is equal to $I_0(d) \Delta d$, where d is a given distance on the x-axis and $\Delta d$ is the step considered (the scale and magnitudes being unimportant for the understanding of the present description). A corresponding density function I(d), matching the actual pair distribution $I_0(d)$ is depicted in FIG. 3. The density function I(d) depicted obeys Eq. (1) in that case. Note that if the density function I(d) considered is continuous, then the number of pairs as approximated by I(d), found within the interval (d, d' dd) is proportional to I(d) dd, where dd is an infinitely small number.

Further comments as to the PDF follow. The function I(d) is typically a mathematically defined function, which describes, once suitably parameterized, the relative likelihood for a pair to be separated from a given distance. This function could be discrete or continuous, analytically (closed-form) or implicitly defined, etc., provided it can be normalized proportionally to the total number of pairs considered. Actually, since N is typically large, whether I(d) is discrete or continuous is not critical. Yet, a continuous function might be preferred in some cases, depending on the algorithm chosen (e.g., a non-linear regression). In this regards, embodiments of the method of the invention typically includes a step of obtaining the parameters of I(d), i.e., according to $I_0(d)$. The PDF can for instance be fitted onto $I_0(d)$, by a nonlinear fit (e.g., a nonlinear least squares fit) or the like, leading to optimal fit parameters. Such methods are known per se. Yet, any other suitable algorithm can be used, to make the PDF match the actual pair distribution, e.g., based on respective Fourier transforms or by forcing I(d) to reproduce some (e.g., automatically) selected values of $I_0(d)$ exactly and solving a subsequent set of equations.

A convenient choice for I(d) is for instance a finite sum of one, two or more (weighted) Gaussian-type functions $g_1$-$g_n$ such as $$I(d) = \sum_{i=1}^{n} a_i g_i(d) = \sum_{i=1}^{n} a_i (\sigma_i \sqrt{2\pi})^{-1} e^{-\frac{(d-\mu_i)^2}{2\sigma_i^2}}, \quad \text{Eq. (1)}$$

where $\mu_i$'s are the position of the centers of the Gaussian functions, $\sigma_i$'s control their widths and $a_i$'s define the relative heights of the peaks (they can be chosen or computed such as to properly normalize I(d)). Alternative definitions are possible, e.g., where $a_i$'s absorb the normalization coefficient ($\sigma_i \sqrt{2\pi})^{-1}$ of the $g_i$'s.

The corresponding cumulative density function (CDF), here noted C(d), writes, in principle, as $$C(d) = \int_{-\infty}^{d} I(t)dt = \sum_{i=1}^{n} a_i \int_{-\infty}^{d} g_i(t)dt = \sum_{i=1}^{n} a_i C_i(d) \quad \text{Eq. (2)}$$

$$= \sum_{i=1}^{n} a_i \frac{1}{2}\left(1 + \text{Erf}\left(\frac{d-\mu_i}{\sqrt{2}\sigma_i}\right)\right).$$

Note that one or more parameters of I(d) could be relaxed during a fit (yet with one or more parameters being typically constrained to yield correct normalization). In variants, one or more parameters are constrained or fixed. Even, some parameters can be directly obtained, e.g., based on an automatic detection of maximum or the like, etc., such that a fit is not systematically required, i.e., there are various possible ways for obtaining the PDF.

In variants, one may use other basis functions such as Cauchy-Lorentz distribution functions (or Lorentz functions), which can also be easily constrained to integrate to the number of pairs considered (while a typical polynomial cannot). Even, discrete analogs to Gaussian functions can be used. Thus, various basis functions can be used. Gaussian or Lorentz functions are nonetheless most convenient for applications such as non-linear fit or the like. Also, they are more effective than e.g., polynomial functions, as the effectiveness of a polynomial fit is very sensitive to the order of the polynomial fitted, at least in the present context. In addition, a polynomial fit may not lead to a local minimum in some cases, making the choice for a threshold subjective. Finally, a sum of Gaussian- or Lorentz-type basis functions allows for more flexibility than other approaches such as Weibul's, where only one option for the threshold exists. In contrast, considering a Gaussian sum (or the like) is particularly advantageous also when a fine tune of the threshold is needed to adjust for small variability in the data.

As to be discussed in more details later, the algorithm may proceed to fit the basis functions all at once or one-by-one (using an iterative process), in order to ensure a safe positioning of the first Gaussian. The condition, e.g., the threshold may for example involves one ($\mu_1$) or two parameters ($\mu_1, \mu_2$), i.e., determining the position of the centre of a respective basis function. Yet, more parameters (e.g., $\sigma_i$'s) can be involved in the definition of the condition. In practice, making use of a simple condition, e.g., defined based on a single parameter such as $\mu_1$ leads already to very convincing results. Still, as we shall see, the condition may also be more involved.

As illustrated in FIG. 3, a small set of basis functions may suffice in practice. In this example, only three Gaussians $g_1$, $g_2$ and $g_3$ are used for I(d), Eq. (1), to fit the histogram of FIG. 2. The fit was actually obtained as estimated by an Expectation-Maximization algorithm, which will be described later. Vertical dashed lines respectively correspond to $\mu_1$-$\mu_3$, the centers of the adjusted Gaussians. Here, the value of $\mu_1$ is retained as a threshold value. Thus, all patterns separated by a distance less than $\mu_1$ shall be grouped in to a same group in the subsequent clustering algorithm.

More generally, a given PDF is relied upon, an optimal parameter of which (or more) allows for determining the similarity condition. For instance, a threshold can be obtained even when the obtained PDF does not exhibit a local minimum, as is the case in FIG. 3.

Next, another embodiment of the present invention is described, which is particularly well suited for applications where a clustering algorithm is desired, which results in groups of patterns having very small variability. Accordingly, a source generated from representative patterns can be safely applied to all patterns, while producing an acceptable yield.

To address this situation, we assume that a cluster (or group) will collect, in fine, patterns that are very similar, to some perturbation. This perturbation arises from design variations or neighboring effects, etc., and is for instance well captured by a Gaussian function, whose centre reflect a mean, yet local perturbation. Thus, one understands that a model I(d) as defined in Eq. (1) may adequately fit an actual pair distribution $I_0(d)$, such as illustrated in FIG. 2. In particular, the first Gaussian (i.e., having the smallest $\mu_i$) is particularly relevant inasmuch as it defines the smallest local mean perturbations. In other words, it defines a low end mean, which is a relevant value for the subsequent clustering algorithm.

Fitting a Gaussian sum is particularly simple and convenient. Yet, other algorithms can be employed, e.g., Fourier transform-based, or using truncated means, to derive a low end mean, representative of the low end mean perturbation. Once a low end mean has been determined, it can be retained to fix the similarity condition.

When using a Gaussian sum such as defined by Eq. (1), the relevant parameters may further be estimated through the so-called Expectation-Maximization (EM) algorithm, see e.g., Chris Fraley, Adrian E. Raftery. Model-based clustering, discriminant analysis, and density estimation.//Technical report No. 380. University of Washington, October 2000. This algorithm requires setting a number of Gaussians expected in the mixture. We might obtain the first Gaussian in an iterative manner. For example, the algorithm starts with an initial value based on the number of samples (distances) given by the distance matrix and keeps increasing the number of Gaussians until parameters of the first Gaussian are converged (within a convergence threshold). Upon completion of the process, and in particular once $\mu_1$ and $\sigma_1$ have converged, the condition can be set accordingly.

In fact, several experiments were carried out, where the following ways to set the threshold have been tested:

First, $Thr=\mu_1$, representing a (low end) average local perturbation. This is perhaps the simplest implementation. In variants, one may use $Thr=\xi \mu_1$, or $Thr=\mu_1+\xi$, $\xi$ real, which allows for lower/higher local perturbations. Tuning $\xi$, e.g., in an iterative fashion, allows for fine tuning the threshold value;

Second, closely related, $Thr=\mu_1+\sigma_1/\xi$, $\xi$ real or integer (e.g., $0.<\xi_{min}<\xi<\xi_{max}$, or $\xi=1$) allows for higher local perturbations, while maintaining Thr in a range consistent with the data variance; and Third, $Thr=(\mu_1+\xi \mu_2)/(1+\xi)$, which sets the threshold between the first and second Gaussians. For example, taking $\xi=1$ puts the threshold in the middle of the two peaks. Again, the threshold value can be fine tuned.

The above cases directly follow from the description of previous embodiments of the present invention, where the condition is said to involve one or more parameters of the PDF matched onto the pair distribution. In each of the above cases, the value of $\xi$ can be (pre-) fixed or fine tuned, e.g., in an iterative way.

Figure 4:
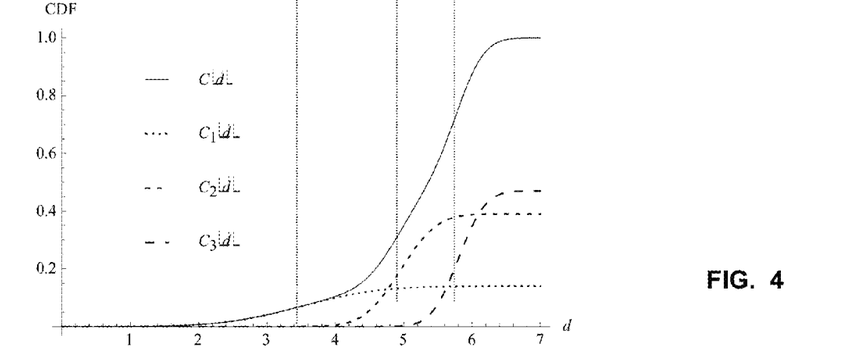

Other tests have been performed:

Fourth, Thr=the local minimum of the envelope of the fitted PDF. Yet, an issue with this method is that a local minimum is not always obtained, such that this option is not preferred (see FIG. 3); and Fifth, cumulative density (or distribution) function (CDF) estimation. In that case, one can pick up a given CDF value and set the threshold to the corresponding x-axis value. For example, in FIG. 4, picking a CDF value of $\approx 0.1$ would result in a threshold value of $\approx 4$, which substantially correspond to the value of $\mu_1$. Appropriate value selection can also be performed in an iterative way, notably if we have an opportunity to evaluate some metrics at runtime.

The above approaches were evaluated through various experiments, yielding convincing results in each case (except the fourth variant which sometimes is impracticable). The first three variants and especially the fifth are preferred inasmuch as a fine tune of the threshold is made possible. Refinement of the threshold can for instance be based on quality metrics.

At present, a suitable similarity measure has been defined and a clustering process may be implemented. Clustering processes are known per se. Generally, a clustering process consists of partitioning a data set into groups so that data in one group are similar to each other and as different as possible from other groups' data. Obviously, the value of a clustering process is often in the eye of the beholder. Yet, in the present case, fixing the similarity condition as described above allows for taking account of a reality hidden in the data themselves, thereby allowing for minimized subjectivity and safe automation.

Suitable algorithms may, in the present context, use a hierarchical clustering (i.e., find successive clusters using previously established clusters), using either an agglomerative or a divisive approach and this, based on distances as evaluated for pattern pairs vs. threshold.

For implementation purposes one may consider to limit the number of patterns or clips considered to prevent prohibitive computational time. There are several possibilities. One may for instance perform pre-clustering operations based on geometric features (polygon count, polygon density), making the number of patterns in pre-calculated clusters more manageable. Other possibilities can be contemplated.

For evaluating the clustering results, use can be made of the so-called "within-cluster scatter" or WCS approach, when no a priori information exits. When a priori information exists, then the measure of purity is used. WCS and purity are examples of suitable clustering evaluation metrics.

The following can be used in order to address performance issues due to a large number of clips. Patterns can for instance be first grouped into redundant sets, e.g., clips that are exactly the same (zero distance) or symmetric in some form (e.g., mirrored). A second step of scaling down the numbers of clips can be performed by separating clips based on geometric features (such as a number of polygons therein, from which distance vectors can be obtained). Note however, that the pattern separation as implemented in the present context may also take into account other geometric features, such as an area spanned by the polygons that defines their density, among other things.

For the sake of illustration, FIG. 5 shows an example of a cluster 10 of patterns 11-16 as obtained in an embodiment of the present invention, which includes six distinct patterns printed without errors. The patterns 11-16 are similar, to a certain extent. In this example, the distances obtained between the depicted patterns are given in table I below, in matrix form. The obtained patterns are not exactly the same (Thr=$\mu_1$=0.9005).

TABLE I distances obtained between the patterns 11-16 shown in FIG. 5

| Patterns | 12 | 13 | 14 | 15 | 16 |
|---|---|---|---|---|---|
| 11 | 0.2834 | 0.2254 | 0.4985 | 0.3612 | 0.5760 |
| 12 | | 0.3678 | 0.2834 | 0.2254 | 0.3479 |
| 13 | | | 0.5992 | 0.2551 | 0.4486 |
| 14 | | | | 0.3830 | 0.2295 |
| 15 | | | | | 0.2551 |

In more details, the distances have been obtained based on features using a vector format of 59 complex coefficients. For performance reasons, use was made of a principal component analysis (PCA): clustering was performed on the projected space (of much smaller dimension). The resulting vector dimension was 9 in that case. For illustration purpose, the corresponding set of features $F_p$ is represented in Table II below:

$\xi$ value, a first set of clusters is obtained. At each step, a purity (if possible) or WCS value is estimated. Next, $\xi$ is varied, such as to obtain a second set of clusters, etc., until sufficiently small in-cluster dispersions are achieved.

On the contrary, if not enough computational resources are available for an iterative estimation, the threshold values can be obtained as devised in the first, second, third, or fifth case above, with a given value of $\xi$ fixed (or a prefix probability value for the fifth case). For example, one may consider $\xi$=1 and thus obtain Thr=$\mu_1$ (case 1).

The tests carried out in the context of the present invention have quantitatively confirmed the efficiency of present embodiments, i.e., wherein a low end local perturbations arising from normal variations in a design is identified, e.g., via a characteristic Gaussian.

For example, one may implement a clustering algorithm using Thr=$\mu_1$ (without further tuning the threshold) and subsequently run a SMO optimization, to obtain the sources for the clusters as a whole and subsets of patterns within the clusters. A reason for doing so is to test the assumption that patterns within a cluster have a same or very similar source. The results obtained have shown that the similarity in the sources and Common Process Window (CPW) values is acceptable. For instance, the variability in the CPW is way below the acceptable 10% value.

Figure 6:
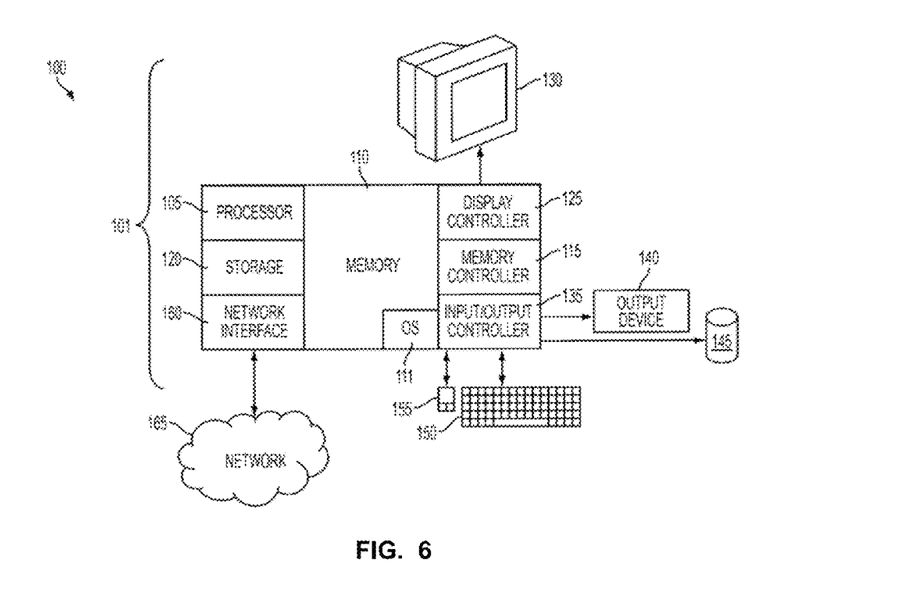
FIG. 6 schematically depicts a computerized system suitable for performing at least parts of methods according to an embodiment of the present invention.

Finally, FIG. 6 illustrates an exemplary embodiment of a computerized system suitable for implementing aspects of the present invention. It will be appreciated that the methods described herein are largely non-interactive, and automated such as a server or embedded system. In the exemplary embodiments, the methods described herein can be implemented either in an interactive or non-interactive system. The methods described herein can be implemented in software (e.g., firmware), hardware, or a combination thereof. In exemplary embodiments, the methods described herein are

TABLE II feature set corresponding to patterns 11-16 in the group 10 of FIG. 5. Vector components of each of the patterns are listed in successive rows.

| Pattern 11 | Pattern 12 | Pattern 13 | Pattern 14 | Pattern 15 | Pattern 16 |
|---|---|---|---|---|---|
| 2.1182 − i0.7130 | 1.7223 − i1.5202 | 2.1211 − i0.5262 | 0.9890 − i1.9663 | 1.7648 − i1.2527 | 1.1049 − i1.6541 |
| 0.2688 − i0.3195 | −0.4201 − i0.8640 | −0.0163 − i0.4218 | 0.4624 − i0.8152 | −0.6363 − i0.9118 | 0.1580 − i0.8679 |
| 0.1004 + i0.3405 | 0.3917 + i0.1395 | −0.1105 − i0.0126 | 0.3109 − i0.1290 | 0.1517 − i0.1935 | 0.0790 − i0.4352 |
| 0.1024 + i0.5162 | 0.0443 + i0.5482 | 0.0986 − i0.3435 | −0.0369 + i0.1306 | 0.0463 − i0.3148 | −0.0268 − i0.6906 |
| 0.2614 + i0.0228 | −0.0336 + i0.1830 | 0.1186 − i0.0314 | 0.0592 + i0.1626 | −0.1469 + i0.1128 | −0.0634 + i0.0944 |
| 0.1575 − i0.0898 | 0.1447 − i0.0468 | −0.1734 − i0.0527 | 0.2343 + i0.0816 | −0.1849 − i0.0140 | −0.1042 + i0.1017 |
| 0.0583 + i0.0616 | 0.0620 + i0.1592 | −0.1597 − i0.1542 | 0.1424 + i0.1527 | −0.1564 − i0.0663 | −0.0840 − i0.0722 |
| 0.1499 − i0.1047 | −0.0316 + i0.0745 | 0.2190 − i0.0472 | −0.3006 − i0.0344 | 0.0557 + i0.1141 | −0.1864 + i0.0162 |
| −0.0559 + i0.0204 | −0.1233 − i0.0834 | −0.0513 − i0.0253 | −0.0048 − i0.0578 | −0.1119 − i0.1187 | −0.0052 − i0.0957 |

Concerning now the possible iterative processes for tuning the threshold: one may for example rely on the CDF (the fifth case above), set a probability value (e.g., between 0.05 and 0.1), and look for an appropriate threshold value with the help of binary search, i.e., the next probability value shall be in one of the intervals [0.05, 0.075] or [0.075, 0.1], etc. At each step, a purity value of the patterns in the groups, if a priori information, e.g., failure or not (markers) of the patterns is available, or a WCS value could be estimated, until achieving a desired value. Yet, experiments have shown that purity and within cluster scatter have almost linear dependency for the patterns weakly perturbed. Thus, WCS values can be used when no information from markers layer is available.

Note that a similar approach can be contemplated for the first three cases above as well. Namely, starting from a given implemented in software, as an executable program, and is executed by a special or general-purpose digital computer, such as a personal computer, workstation, minicomputer, or mainframe computer. The system 100 therefore includes general-purpose computer 101.

In the exemplary embodiments, in terms of hardware architecture, as shown in FIG. 6, the computer 101 includes a processor 105, memory 110 coupled to a memory controller 115, and one or more input and/or output (I/O) devices 140, 145 (or peripherals) that are communicatively coupled via a local input/output controller 135. The input/output controller 135 can be, but is not limited to, one or more buses or other wired or wireless connections, as is known in the art. The input/output controller 135 may have additional elements, which are omitted for simplicity, such as controllers, buffers (caches), drivers, repeaters, and receivers, to enable communications. Further, the local interface may include address, control, and/or data connections to enable appropriate communications among the aforementioned components. As described herein the I/O devices 140, 145 can be any generalized cryptographic card or smart card known in the art.

The processor 105 is a hardware device for executing software, particularly that stored in memory 110. The processor 105 can be any custom made or commercially available processor, a central processing unit (CPU), an auxiliary processor among several processors associated with the computer 101, a semiconductor based microprocessor (in the form of a microchip or chip set), a macroprocessor, or generally any device for executing software instructions.

The memory 110 can include any one or combination of volatile memory elements (e.g., random access memory (RAM, such as DRAM, SRAM, SDRAM, etc.)) and nonvolatile memory elements (e.g., ROM, erasable programmable read only memory (EPROM), electronically erasable programmable read only memory (EEPROM), programmable read only memory (PROM), tape, compact disc read only memory (CD-ROM), disk, diskette, cartridge, cassette or the like, etc.). Moreover, the memory 110 may incorporate electronic, magnetic, optical, and/or other types of storage media. Note that the memory 110 can have a distributed architecture, where various components are situated remote from one another, but can be accessed by the processor 105.

The software in memory 110 may include one or more separate programs, each of which includes an ordered listing of executable instructions for implementing logical functions. In the example of FIG. 6, the software in the memory 110 includes methods described herein in accordance with exemplary embodiments and a suitable operating system (OS) 111. The OS 111 essentially controls the execution of other computer programs, such as the methods as described herein, and provides scheduling, input-output control, file and data management, memory management, and communication control and related services.

The methods described herein may be in the form of a source program, executable program (object code), script, or any other entity including a set of instructions to be performed. When the method is in the form of a source program, then the program needs to be translated via a compiler, assembler, interpreter, which may or may not be included within the memory 110, so as to operate properly in connection with the OS 111. Furthermore, the methods can be written as an object oriented programming language, which has classes of data and methods, or a procedure programming language, which has routines, subroutines, and/or functions.

In the exemplary embodiments, a conventional keyboard 150 and mouse 155 can be coupled to the input/output controller 135. Other output devices such as the I/O devices 140, 145 may include input devices, for example but not limited to a printer, a scanner, microphone, and the like. Finally, the I/O devices 140, 145 may further include devices that communicate both inputs and outputs, for instance but not limited to, a network interface card (NIC) or modulator/demodulator (for accessing other files, devices, systems, or a network), a radio frequency (RF) or other transceiver, a telephonic interface, a bridge, a router, and the like. As described herein the I/O devices 140, 145 can be any generalized cryptographic card or smart card known in the art. The system 100 can further include a display controller 125 coupled to a display 130. In exemplary embodiments, the system 100 can further include a network interface 160 for coupling to a network 165. The network 165 can be an IP-based network for communication between the computer 101 and any external server, client and the like via a broadband connection. The network 165 transmits and receives data between the computer 101 and external systems. In exemplary embodiments, network 165 can be a managed IP network administered by a service provider. The network 165 may be implemented in a wireless fashion, e.g., using wireless protocols and technologies, such as WiFi, WiMax, etc. The network 165 can also be a packet-switched network such as a local area network, wide area network, Internet network, or other type of network environment. The network 165 may be a fixed wireless network, a wireless local area network (LAN), a wireless wide area network (WAN) a personal area network (PAN), a virtual private network (VPN), intranet or other suitable network system and includes equipment for receiving and transmitting signals.

If the computer 101 is a PC, workstation, intelligent device or the like, the software in the memory 110 may further include a basic input output system (BIOS) (omitted for simplicity). The BIOS is stored in ROM so that the BIOS can be executed when the computer 101 is activated.

When the computer 101 is in operation, the processor 105 is configured to execute software stored within the memory 110, to communicate data to and from the memory 110, and to generally control operations of the computer 101 pursuant to the software. The methods described herein and the OS 111, in whole or in part are read by the processor 105, perhaps buffered within the processor 105, and then executed.

When the systems and methods described herein are implemented in software, as is shown in FIG. 6, the methods can be stored on any computer readable medium, such as storage 120, for use by or in connection with any computer related system or method.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

A combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

The program code embodied on a computer readable medium may be transmitted using any appropriate medium, including but not limited to wireless, wireline, optical fiber cable, RF, etc., or any suitable combination of the foregoing.

The computer program code for carrying out operations for the embodiments of the present invention may be written in a combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The embodiments of the present invention are described above with reference to flowchart illustrations and/or block diagrams of methods, apparatus (systems) and computer program products according to embodiments of the invention. It will be understood that each block of the flowchart illustrations and/or block diagrams can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which includes one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims. For example, many possible similarity measures could be relied upon. For example, any similarity measure that can be expressed via a distance function could be employed. Also, the distance function used for evaluating the distance matrix or the like needs not be formally the same as that used in the clustering algorithm, provided it leads to results consistent with the distance matrix or the like.

What is claimed is:

1. A computer-implemented method of optimization of a manufacturing process of an integrated circuit or IC layout, the method comprising:
    receiving input;
    organizing IC patterns;
    selecting IC patterns amongst the organized IC patterns; and
    optimizing a design of a manufacturing process of the IC layout based on the selected IC patterns using a computer;
    wherein the steps of receiving input and organizing IC patterns are performed prior to selecting IC patterns and the step of organizing IC patterns includes a condition to be satisfied of the IC patterns; and
    wherein the input comprises:
    a set P of IC patterns $S_1, \ldots S_P$ extracted from the IC layout and a set F of features $F_1, \ldots F_P$, respectively associated to the IC patterns of the set P; and
    a distance function $D(F_i, F_j)$ for evaluating a distance $d=D(F_i, F_j)$ between two IC patterns $S_i$, $S_j$, based on respective features $F_i$, $F_j$ thereof, such that a distribution of pairs $I_0(d)$ can be determined, wherein the pairs $I_0(d)$ are of IC patterns of the set P with respect to a distance d between the pairs.

2. The method according to claim 1, wherein the input further comprises:
    a probability distribution function I(d) (PDF) that has one or more parameters such that the PDF matches the distribution $I_0(d)$ of pairs of IC patterns,
    wherein at the step of organizing IC patterns, the condition can be satisfied via the one or more parameters of the PDF or a related function.

3. The method according to claim 2, further comprising:
    obtaining the one or more parameters of the PDF, wherein obtaining is performed prior to receiving the PDF as input.

4. The method according to claim 3, wherein:
the step of obtaining the one or more parameters of the PDF comprises fitting the PDF onto $I_0(d)$, by adjusting the one or more parameters of the PDF.

5. The method according to claim 3, wherein:
the PDF received can be analytically defined as a finite sum of one or more Gaussian-type functions $g_1(d)$-$g_n(d)$.

6. The method according to claim 5, wherein:
at the step of organizing IC patterns, the condition includes at least one parameter $\mu_1$ that determines a low end average local perturbation of one of the one or more Gaussian-type functions.

7. The method according to claim 5, wherein:
at the step of organizing IC patterns, the condition includes at least two parameters of the one or more Gaussian-type functions.

8. The method according to claim 6, wherein at the step of organizing IC patterns, the condition further includes a parameter $\mu_1$ that determines the low end average local perturbation of one of the one or more Gaussian-type functions and a parameter $\sigma_1$ that controls a corresponding width associated with a graphical curve relating to the Gaussian function.

9. The method according to claim 2, wherein:
the related function is a cumulative distribution function (CDF) that corresponds to the PDF; and
at the step of organizing IC patterns, the condition is satisfied by setting the condition according to a chosen value of the CDF.

10. The method according to claim 1, wherein a low end mean distance of a Gaussian function is determined via an iterative procedure.

11. The method according to claim 1, wherein the condition at the step of organizing IC patterns is tuned based on an iterative procedure.

12. The method according to claim 1, wherein the input further comprises:
a set P of IC patterns $S_1, \ldots S_P$ extracted from the IC layout and respective features $F_1, \ldots F_P$,
wherein each of the respective features are extracted from the IC layout and preferably have a same vector format; and
each of the respective features is mapped onto the set P of IC patterns $S_1, \ldots S_P$, such that the distance function $D(F_i, F_j)$ can be evaluated for two IC patterns $S_i, S_j$, taking respective features $F_i, F_j$ of the two IC patterns as arguments.

13. A computer-implemented method of manufacturing an integrated circuit (IC), based on a manufacturing process designed according to the method of claim 1.

14. A non-transitory article of manufacture tangibly embodying computer readable instructions which, when implemented, cause a computer to carry out the steps of the method of optimization of a manufacturing process of an integrated circuit or IC layout, the method comprising:
receiving input;
organizing IC patterns;
selecting IC patterns amongst the organized IC patterns; and
optimizing a design of a manufacturing process of the IC layout based on the selected IC patterns;
wherein the steps of receiving input and organizing IC patterns are performed prior to selecting IC patterns and the step of organizing IC patterns includes a condition to be satisfied of the IC patterns; and
the input comprises:
a set P of IC patterns $S_1, \ldots S_P$ extracted from the IC layout and a set F of features $F_1, \ldots F_P$, respectively associated to the IC patterns of the set P; and
a distance function $D(F_i, F_j)$ for evaluating a distance $d = D(F_i, F_j)$ between two IC patterns $S_i, S_j$, based on respective features $F_i, F_j$ thereof, such that a distribution of pairs $I_0(d)$ can be determined, wherein the pairs $I_0(d)$ are of IC patterns of the set P with respect to a distance d between the pairs.

15. A computer system having a processor operatively interconnected to a memory device, a graphical display device, a user input device, and a graphical user interface displayed in the graphical display device, allowing the computer system to implement the method of optimization of a manufacturing process of an integrated circuit or IC layout, the method comprising:
receiving input;
organizing IC patterns;
selecting IC patterns amongst the organized IC patterns; and
optimizing a design of a manufacturing process of the IC layout based on the selected IC patterns;
wherein the steps of receiving input and organizing IC patterns are performed prior to selecting IC patterns and the step of organizing IC patterns includes a condition to be satisfied of the IC patterns; and
the input comprises:
a set P of IC patterns $S_1, \ldots S_P$ extracted from the IC layout and a set F of features $F_1, \ldots F_P$, respectively associated to the IC patterns of the set P; and
a distance function $D(F_i, F_j)$ for evaluating a distance $d = D(F_i, F_j)$ between two IC patterns $S_i, S_j$, based on respective features $F_i, F_j$ thereof, such that a distribution of pairs $I_0(d)$ can be determined, wherein the pairs $I_0(d)$ are of IC patterns of the set P with respect to a distance d between the pairs.

* * * * *